United States Patent
Nagai et al.

(10) Patent No.: US 6,489,013 B2
(45) Date of Patent: Dec. 3, 2002

(54) RESIN COMPOUND, AND ADHESIVE FILM, METAL-CLAD ADHESIVE FILM, CIRCUIT BOARD, AND ASSEMBLY STRUCTURE, USING THE RESIN COMPOUND

(75) Inventors: Akira Nagai, Hitachi (JP); Masayuki Noda, Hikone (JP)

(73) Assignees: Hitachi, Ltd., Tokyo (JP); Shin-Kobe Electric Machinery, Tokyo (JP)

( * ) Notice: Subject to any disclaimer, the term of this patent is extended or adjusted under 35 U.S.C. 154(b) by 0 days.

(21) Appl. No.: 09/788,465

(22) Filed: Feb. 21, 2001

(65) Prior Publication Data

US 2001/0018986 A1 Sep. 6, 2001

(30) Foreign Application Priority Data

Feb. 21, 2000 (JP) .......................................... 2000-048944

(51) Int. Cl.[7] .............................. B32B 3/00; C08L 83/08
(52) U.S. Cl. .................... 428/209; 528/38; 525/474; 525/403; 525/476; 524/837; 524/743; 524/744; 524/753; 524/770; 556/413
(58) Field of Search ............................ 528/38; 556/413; 525/474, 403, 476; 524/837, 743, 744, 753, 770

(56) References Cited

U.S. PATENT DOCUMENTS

| | | | | |
|---|---|---|---|---|
| 3,649,892 A | * | 3/1972 | Booe .......................... | 317/258 |
| 3,851,363 A | * | 12/1974 | Booe .......................... | 29/25.42 |
| 5,065,285 A | * | 11/1991 | Nagai et al. ................. | 361/414 |
| 5,677,393 A | * | 10/1997 | Ohmori et al. .............. | 428/413 |
| 5,691,401 A | * | 11/1997 | Morita et al. ............... | 523/435 |
| 6,045,886 A | * | 4/2000 | Oka et al. .................... | 428/212 |
| 6,252,010 B1 | * | 6/2001 | Takeuchi et al. ............ | 525/403 |

FOREIGN PATENT DOCUMENTS

| JP | 11-261242 | * | 9/1999 |
|---|---|---|---|
| JP | 11-327135 | * | 11/1999 |
| JP | 11-340624 | * | 12/1999 |

OTHER PUBLICATIONS

Electronic Parts and Maerials, No. 10 (1998) p. 6–23 and p. 28–31.*

* cited by examiner

*Primary Examiner*—Cathy Lam
(74) *Attorney, Agent, or Firm*—Antonelli, Terry, Stout & Kraus, LLP

(57) ABSTRACT

A resin compound, which causes very little thermal stress even when a flip chip is mounted, has a low modulus of elasticity, and a heat resistance which is sufficiently high for solder floating at 300° C., and the resin compound also can be used in an adhesive film, a metal-clad adhesive film, a circuit board, and an assembly structure. The resin compound contains (A) a polyamide imide with siloxane bond, (B) a acrylic polymer with a weight-average molecular weight of 500,000 or more, (C) a thermoset resin, and (D) a solvent.

12 Claims, 3 Drawing Sheets

RESIN COMPOUND, AND ADHESIVE FILM, METAL-CLAD ADHESIVE FILM, CIRCUIT BOARD, AND ASSEMBLY STRUCTURE, USING THE RESIN COMPOUND

BACKGROUND OF THE INVENTION

The present invention relates to a resin compound and to an adhesive film with excellent heat resistance, electrical properties, adhesion to metal and, at the same time, low elastic modulus; and the invention also relates to a circuit board and an assembly structure using these elements. The resin compound and adhesive film of the invention are applicable widely to the surface circuit layer and/or stress compliance layer of a circuit board. Because the circuit board of the invention has a low modulus of elasticity, it is most suitable for flip chip technology.

The latest technical innovations are remarkable in providing electronic devices, such as personal mobile data terminals, that are smaller in size, lighter in weight and higher in performance. As an assembly of these electronic devices, flip chip technology or a chip scale package (CSP) structure that makes it possible to realize high-density and compact packaging has come to be employed instead of conventional resin encapsulated semiconductor packaging using a resin compound made of epoxy resin and an inorganic filler.

As indicated above, a high-density compact package is frequently made of a grid array structure because, when the package is mounted on a circuit board, a number of pins must be arranged in a small area as external terminals for the package. Since there is a technical limitation to high-density packaging on a conventional circuit board for the above reason, a board with a surface laminate wiring circuit that has no through-hole, but comprises via-holes only, has been in use. As a material for forming a fine wiring circuit on a board surface, there are available a photo-via material, on which a wiring circuit is formed by exposure and development processes, and a laser-via material, on which holes are machined by laser beam or the like. Brief technology of the above type has been disclosed, for example, in "Printed Circuit Board Applicable to High-Density Packaging—Present Status and Problems of Build-up Circuit Board Technology" of "Electronic Material" issued by Industrial Research Association, October 1998 issue.

Generally speaking, a material with high heat resistance, typically such as a polyimide, has a high modulus of elasticity. For this reason, if a packaging device with low coefficient of thermal expansion and high modulus of elasticity, such as a flip chip, is mounted on a polyimide circuit board, a question as to its reliability arises because of possible disconnection due to the thermal stress caused between the board and the device.

On the other hand, because the heat resistance of a rubber-added material with a low modulus of elasticity is generally lower, a question arises concerning the heat resistance against high-temperature bath solder (lead free solder) at about 300° C.

The present invention provides a resin compound, which causes very little thermal stress even when a flip chip is mounted, which has a low modulus of elasticity, and which has a high heat resistance sufficient for solder floating at 300° C., and the present invention also provides an adhesive film, a circuit board, and an assembly structure using the resin compound.

SUMMARY OF THE INVENTION

The means of solving the above problems in accordance with the present invention are as follows.

The first aspect of the invention involves a resin compound containing (A) a polyamide imide with siloxane bond, (B) an acrylic polymer with weight-average molecular weight of 500,000 or more, (C) a thermoset resin, and (D) a solvent.

The second aspect of the invention involves an adhesive film having the above-mentioned resin compound. This adhesive film provides an adhesive material that has both a low modulus of elasticity and high heat resistance, and also provides excellent adhesion to metal and electrical properties.

The use of (A) a polyamide imide with siloxane bond as an essential component in accordance with the invention makes it possible to maintain a low modulus of elasticity without lowering the heat resistance. The polyamide imide with a siloxane bond has superior solubility to solvent, as compared to the polyimides having a similar heat resistance, and it also has excellent miscibility with other polymers. It is a suitable component for realizing the effect of the resin compound of the present invention.

In addition, since the component (A) above has a siloxane bond, it has a higher miscibility with other components of the invention, including acrylic polymer and epoxy resin. As a result, a uniform film with no layer separation can be provided in a broad range of composition (mixture).

Particularly, in combining with a high molecular-weight acrylic polymer, the miscibility is an important issue. The siloxane bond content in the acrylic polymer structure is preferred to be 20 to 80 weight %. If it is less than 20 weight %, the miscibility decreases and a uniform resin compound with acrylic polymer cannot be obtained. If it exceeds 80 weight %, the adhesion to metal decreases, and, when a fine wiring circuit is formed, a lower reliability.

In accordance with the present invention, by using a polyamide imide containing a siloxane bond, it is possible to realize excellent miscibility with a high molecular-weight acrylic polymer, and, at the same time, to drastically lower the modulus of elasticity relative to that of conventional polyamide imide.

In accordance with the invention, (A) a polyamide imide with a siloxane bond represents a condition where, for example, an amide bond or an imide bond is bonded with the siloxane bond.

To be specific, a polymer that at least contains an amide bond, an amide bond as the main chain of an imide precursor, and the following bond unit is preferred:

(X and Y in the above formula are an organic group including an aliphatic or aromatic group, and can be equal or different. Z is a siloxane bond.)

Besides, a polymer that contains a siloxane bond as the end group of an amide bond and an amide bond as the main chain of an imide precursor as follows, for example, is also effective:

(X and Y in the above formula are an organic group including an aliphatic or aromatic group, and can be equal or different. Z is a siloxane bond.)

In accordance with the present invention, by using (B) a acrylic polymer with a weight-average molecular weight of 500,000 or more, it is possible to realize a low modulus of elasticity without lowering the heat resistance. If an acrylic polymer with a weight-average molecular weight of less than 500,000 is used, sufficient properties, including heat resistance and electrical properties, cannot be attained. The use of a high molecular-weight polymer with weight-average molecular weight of 500,000 or more makes it possible to attain stable properties.

The mix ratio of the above component (A) to component (B) is preferably 3:1 to 1:5 by weight. In mixing the two, from the point of view of lowering the modulus of elasticity, increasing the mix ratio of the component (B), i.e. the acrylic polymer, is preferable so as to increase the resolution in film forming and the adhesion to metal. However, increasing the component (B), i.e. the acrylic polymer, in excess of the mix ratio 1:5 results in insufficient properties, including heat resistance and electrical properties.

It is also preferable when the glass transition temperature of the acrylic polymer is 0° C. or less. Because of this, the modulus of elasticity under a range of 0 to 150° C., a normal operating environment, can be maintained low.

Since use of a combination of the above components (A) and (B) in accordance with the present invention is not sufficient enough to maintain the properties at high temperature, it is preferred to utilize a component that forms a cross-linked structure so as to maintain the solder heat resistance at 300° C. or above.

A thermoset resin is a component that forms a cross-linked structure. It is available in the form of, for example, an epoxy resin, a maleimide resin, a cyanate resin, an isocyanate resin, a phenol resin, an allyl resin, an unsaturated polyester resin, a butadiene resin, a silicone resin, a vinyl ester resin, and a silicone resin. Among all these, a epoxy resin that comprises an epoxy compound, a hardener containing a phenol group, and an imidazole curing accelerator is the most preferable.

Because a epoxy resin before cross-linking is generally a low molecular-weight compound or low molecular weight polymer, it contributes to improved wettability in bonding a film with various materials and brings about an effect of increasing the adhesion to metal.

In accordance with the present invention, the addition of the thermoset resin component (C) is preferred to be 5 to 50 weight % of the entire film. If it is less than 5 weight %, the effect of utilizing a cross-linked structure formed by the thermoset resin component cannot be produced sufficiently, and, consequently, sufficient heat resistance at high temperature cannot be attained. If it exceeds 50 weight %, the modulus of elasticity tends to increase, and, consequently, the resolution in film forming is negatively affected.

The epoxy resin of the invention can be a compound used in a semiconductor sealing material or printed circuit board material. It is available in the form of, for example, a phenol novolac type epoxy resin, a cresol novolac type epoxy resin, a bisphenol type epoxy resin, including bisphenol A, bisphenol F and bisphenol S type epoxy resins, a multi-functional epoxy resin of phenol resin or cresol resin, and a bi-functional or tri-functional epoxy resin having a naphthalene skeleton, antracene skeleton or dicyclo-pentadiene skeleton.

A publicly known compound is applicable as the hardener for the above-mentioned epoxy resins. Among all these, a compound having two or more phenolic hydroxyl groups is preferable. It is available in the form of, for example, a phenol novolac resin, a condensation polymer of phenol and aralkyl ether, a bisphenol resin, an o-cresol novolac resin, and a poly p-vinyl phenol.

As needed, a publicly known compound is applicable as the curing accelerator. It is available in the form of, for example, an imidazole compound, a tertiary phosphate compound, a quaternary phosphate compound, a complex of a tertiary phosphate compound and a borate compound, a complex of a quaternary phosphate compound and a borate compound, a tertiary amine, a borate complex salt, Lewis acid, an inorganic acid, a short-chain amide, a dihydrazide, a titanic ester, and a cationic or anionic catalyst. Among all these, an imidazole compound is preferable because it excellently adds to the heat resistance, adhesion, and shelf life of the material.

If the physical properties of the adhesive film of the present invention after heating and curing allow the modulus of elasticity at 50° C. to be less than 1 GPa, the thermal stress caused by temperature variation can be reduced drastically at the time when a flip chip is mounted on the film, and the reliability under a thermal cycle and other conditions can be improved tremendously.

In accordance with the present invention, the solvent component (D) has no particular limit provided that the thermoset polymer as the above components (A) and (B) and the epoxy resin, hardener, and curing accelerator as the component (C) can be evenly mixed in it. A preferable solvent is, for example, acetone, methyl ethyl ketone, methyl isobutyl ketone, methyl cellosolve, y-butyrolactone, N,N-dimethyl formamide, N-methyl-2-pyrrolidone, toluene, dimethyl acetamide, cyclohexanone, or isopropyl alcohol, and a mixed solvent of two or more of the above is allowable.

An additive, such as an inorganic filler, colorant. or flame retardant can be added so long as the properties of the resin compound and the adhesive film of the invention are not affected.

The third aspect of the invention involves a metal-clad adhesive film that utilizes the resin compound of the first aspect of the invention as an insulation layer. By use of the metal-clad adhesive film as wiring material for the below-mentioned build-up structure, the process can be simplified.

The resin compound of the present invention is bonded onto a metal foil by a process in which a specified amount of the resin compound containing solvent is applied on a metal foil and then the metal foil and the resin film are bonded together as the solvent is removed by heating, depressurizing, or other processing. The metal foil has no specific limit provided that it serves as a conductor forming a circuit, but copper is preferable. A metal-clad adhesive film is available in a structure where a metal foil is formed on one side of the film or on both sides of the film.

The fourth aspect of the present invention involves a circuit board having a built-up structure where the adhesive film of the second aspect of the invention is arranged on the circuit board and the circuit layer of the circuit board is electrically connected to external terminals. The adhesive film to be arranged on the circuit board can be either a simple adhesive film or the above-mentioned metal-clad adhesive film.

If a simple adhesive film is arranged on a circuit board, the circuit board having a built-up structure can be obtained by a process in which, after holes for via-hole connection are drilled at specified positions using a laser machine or the like, the board is subjected to roughing and conductor plating so as to form a wiring circuit and attain the continuity to the lower circuit board by means of connection through the via-holes. By repeating this process as needed, a built-up circuit board having a multi-layer structure can be provided.

If a metal-clad adhesive film is arranged on a circuit board, holes are made at necessary positions of the metal foil beforehand by etching or other means and then holes for via-hole connection are drilled in the film by a laser machine or the like, utilizing the metal foil as a mask. Then, the holes for via-hole connection are made conductive by plating, and lastly a wiring circuit is etched on the metal foil. Thus, a circuit board having a built-up structure is formed. By repeating this process as needed, a built-up circuit board having a multi-layer structure can be provided.

The fifth aspect of the present invention involves an assembly structure in which a flip chip is mounted on the circuit board having a built-up structure according the fourth aspect of the invention. The surface of a circuit board with the built-up structure to mount a flip chip is made of an insulation layer with a low modulus of elasticity. The use of the assembly structure can drastically reduce the thermal stress to be caused by the difference in the coefficient of thermal expansion between the flip chip and the circuit board. Thus, it becomes possible to secure connection reliability under a thermal cycle and other conditions without using an underfill resin that was needed in the prior art.

The present invention can reduce cost, including the material and process cost, tremendously. Because no underfill resin is needed, the invention makes it possible to perform repairs more easily than before and can contribute greatly to improvement of the yield. dr

DETAILED DESCRIPTION OF THE INVENTION

Figure 1:
FIG. 1 is a diagram showing a cross-sectional view of an adhesive film.

The present invention will be explained in more detail with reference to various embodiments.

[Embodiment 1]

100 g of polyamide imide with siloxane (made by Hitachi Chemical Co., Ltd.: PS6800, siloxane content: 49 weight %) and 400 g of high molecular-weight acrylic polymer (made by Hitachi Chemical Co., Ltd.: PS4000, weight-average molecular weight: 900,000) were evenly mixed into a mixed solvent of methyl isobutyl ketone and γ-butyrolactone (weight ratio=2:1).

In addition, to use maleimide resin as the thermoset resin, 58 g of 4,4-bismaleimide diphenyl methane (made by Mitsui Chemicals, Inc.) and 67 g of 2,2-bis (4- (4-aminophenoxy) phenyl) propane (made by Mitsui Chemicals, Inc.) were added as components and varnish having a solid content of 25 weight % was produced.

The varnish was applied over a polyester film, and then the solvent was removed by heating at 130° C. for 5 minutes and a sample of 50 μm thick was produced. The sample was subjected to heating at 200° C. for 30 minutes and finally a hardened product was obtained. The hardened product was then subjected to periodic strain by a visco-elastic measuring apparatus and the complex modulus of elasticity was measured. The measure storage modulus at 50° C. was 9.6 MPa, and it was confirmed that the product had a low modulus of elasticity (0.1 GPa or less). Besides, the thermal gravimetric measurement of the hardened product at 350° C. resulted in 2% or less, and it was confirmed that the product had excellent heat resistance.

[Embodiment 2]

100 g of polyamide imide with siloxane (made by Hitachi Chemical Co., Ltd.: PS6800, siloxane content: 49 weight %) and 200 g of high molecular-weight acrylic polymer (made by Hitachi Chemical Co., Ltd.: PS4000, weight-average molecular weight: 900,000) were evenly mixed into a mixed solvent of methyl ethyl ketone and γ-butyrolactone (weight ratio=3:1).

In addition, to use epoxy resin as the thermoset resin, 49 g of cresol novolac type epoxy resin (made by Sumitomo Chemical Co., Ltd.: EOCN 195-3) and 26 g of phenol novolac resin (made by Meiwa Chemical Co., Ltd.: H-1) were added as components and 1.0 g of tertiary amine compound (made by Sanyo Chemical Co., Ltd.: 1,8-bicyclo (5,4,0)-undecen (DBU), was used as a curing accelerator, and varnish having a solid content of 20 weight % was produced.

The varnish was applied over a polyester film, and then the solvent was removed by heating at 120° C. for 10 minutes and a sample which was 70 μm thick was produced. The sample was subjected to heating at 200° C. for 30 minutes and finally a hardened product was obtained. The storage modulus of the hardened product at 50° C. was measured in a similar manner as in Embodiment 1. The result was 15.3 MPa, and it was confirmed that the product had a low modulus of elasticity (0.1 GPa or less). Besides, the thermal gravimetric measurement of the hardened product at 350° C. resulted in 1% or less, and it was confirmed that the product had excellent heat resistance. Further, when the hardened product was made to absorb moisture in a PCT (pressure cooker test) at 121° C. for 168 hours, the coefficient of saturated moisture absorption was 0.85 weight %, which means that the use of an epoxy compound as a cross-linking component results in lower coefficient of saturated moisture absorption (2 weight % or less).

[Embodiment 3]

200 g of polyamide imide with siloxane (made by Hitachi Chemical Co., Ltd.: PS6800, siloxane content: 49 weight %) and 100 g of high molecular-weight acrylic polymer (experimental product, weight-average molecular weight: 700,000, glass transition temperature: 5° C.) were evenly mixed into a dimethyl formamide solvent.

In addition, to use cyanate resin as the thermoset resin, 200 g of bi-functional type cyanate resin (made by ASAHI-CHIBA Co., Ltd.: AroCy™M-50) and 10 g of phenol novolac resin (made by Meiwa Chemical Co., Ltd.: H-1) were added as components along with 0.1 g of cobalt naphthanate (made by Wako Pure Chemical Industries, Ltd.), and varnish having a solid content of 30 weight % was produced. The varnish was applied over a polyester film, and then the solvent was removed by heating at 130° C. for 15 minutes and an adhesive film of 80 μm thick as shown in FIG. 1 was produced. Table 1 shows the physical properties of the produced adhesive film. With the adhesive film according to this embodiment, it is possible to attain superior properties in that the modulus of elasticity at 50° C. is low (0.1 GPa or less) and the solder heat resistance is high enough to prevent blistering and other faults in solder floating at 300° C.

[Embodiment 4]

100 g of polyamide imide with siloxane (made by Hitachi Chemical Co., Ltd.: PS6500, siloxane content: 35 weight %) and 100 g of high molecular-weight acrylic polymer (experimental product, weight-average molecular weight: 1,200,000, glass transition temperature: 10° C.) were evenly mixed into a cyclohexanone solvent.

In addition, to use epoxy resin as the thermoset resin, 53 g of multi-functional type epoxy resin (made by Petrochemical Shell Epoxy Co., Ltd.: EP-1032) and 33 g of phenol novolac resin (made by Meiwa Chemical Co., Ltd.: H-1) were added as components along with 0.34 g of imidazole compound (made by Shikoku Chemicals Corp.: 2E4MZ) as a curing accelerator, and varnish having a solid content of 40 weight % was produced.

The varnish was applied over a polyester film, and then the solvent was removed by heating at 140° C. for 5 minutes and an adhesive film of 60 μm thick as shown in FIG. 1 was produced. Table 1 shows the physical properties of the produced adhesive film. With the adhesive film according to this embodiment, it is possible to attain superior properties in that the modulus of elasticity at 50° C. is low (0.1 GPa or less) and the solder heat resistance is high enough to prevent blister and other faults in solder floating at 300° C. It is also possible to attain an adhesive film with extremely excellent adhesion to copper.

[Embodiment 5]

100 g of polyamide imide with siloxane (made by Hitachi Chemical Co., Ltd.: PS6500, siloxane content: 35 weight %) and 300 g of high molecular-weight acrylic polymer (experimental product, weight-average molecular weight: 800,000, glass transition temperature: −20° C.) were evenly mixed into a N-methyl-2-pyrrolidone solvent.

In addition, to use maleimide resin as the thermoset resin, 35 g of 2,2-bis(4-(4-maleimide phenoxy) phenyl) propane (made by Mitsui Chemicals, Inc.) and 9 g of 2,2-bis(4-(4-cyanamide phenoxy) phenyl) propane (made by Mitsui Chemicals, Inc.) were added as components, and varnish having a solid content of 50 weight % was produced.

The varnish was applied over a polyester film, and then the solvent was removed by heating at 125° C. for 20 minutes, whereby an adhesive film 40 μm thick as shown in FIG. 1 was produced. Table 1 shows the physical properties of the produced adhesive film. By keeping the glass transition temperature of the acrylic polymer at 0° C. or below, the produced film can have a low modulus of elasticity (0.1 GPa or less) in the entire temperature range from 0 to 150° C., which is a typical operating environment. Lowering the glass transition temperature makes it possible to attain a higher adhesion to copper under room temperature.

[Embodiment 6]

100 g of polyamide imide with siloxane (made by Hitachi Chemical Co., Ltd.: PS6800, siloxane content: 49 weight %) and 300 g of high molecular-weight acrylic polymer (made by Hitachi Chemical Co., Ltd.: PS4000, weight-average molecular weight: 900,000) were evenly mixed into a mixed solvent of methyl isobutyl ketone and cyclohexanone (weight ratio=1:1).

In addition, to use epoxy resin as the thermoset resin, 65 g of cresol novolac type epoxy resin (made by Sumitomo Chemical Co., Ltd.: EOCN 195-3) and 35 g of phenol novolac resin (made by Meiwa Chemical Co., Ltd.: H-1) were added as components along with 0.45 g of imidazole compound (made by Shikoku Chemicals Corp.: 2E4MZ) as a curing accelerator, and varnish having a solid content of 30 weight % was produced.

Figure 2:
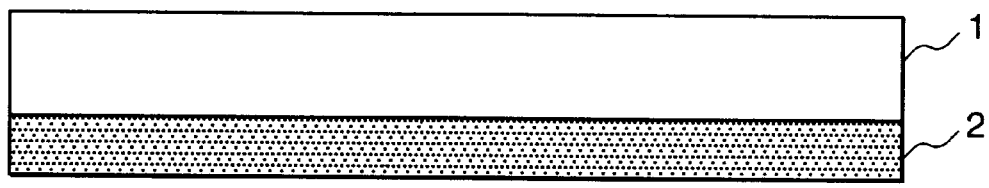
FIG. 2 is a diagram showing a cross-sectional view of an adhesive film on one side of which a metal foil is arranged.

The varnish was applied over a copper foil (0.018 mm thick), and then the solvent was removed by heating at 130° C. for 10 minutes, whereby a metal-clad adhesive film 50 μm thick as shown in FIG. 2 was produced. Table 1 shows the physical properties of the produced adhesive film. The modulus of elasticity and glass transition temperature are the properties of the resin only. As explained in connection with this embodiment, a metal-clad adhesive film can be obtained by applying varnish over a metal foil. The adhesion of the resin to copper foil was measured in accordance with the method specified in JIS C 6481. The measurement showed that the adhesive strength to copper foil was as high as 2.4 kN/m as a result of having applied varnish over a copper foil, as compared to a result of bonding an adhesive film onto the copper foil. In addition, a similar test was conducted using an aluminum foil, and the result was as high as 3.5 kN/m. That is, a metal-clad adhesive film with excellent adhesion to copper, aluminum, 42-alloy, nickel, and other metals was obtained by varying the combination of the epoxy resin.

[Embodiment 7]

90 g of polyamide imide with siloxane (made by Hitachi Chemical Co., Ltd.: PS6800, siloxane content: 49 weight %) and 360 g of high molecular-weight acrylic polymer (experimental product, weight-average molecular weight: 800,000, glass transition temperature: −15° C.) were evenly mixed into a N-methyl-2-pyrrolidone solvent.

In addition, to use epoxy resin as the thermoset resin, 80 g of biphenyl type epoxy resin (made by Petrochemical Shell Epoxy Co., Ltd.: YX-4000H) and 70 g of xylylene type phenol resin (made by Mitsui Chemicals, Inc.: XL-225) were added as components along with 1.07 g of triphenyl phosphine (made by Hokko Chemical Industry Co., Ltd.: TPP) as a curing accelerator, and varnish having a solid content of 35 weight % was produced.

The varnish was applied over a copper foil (0.018 mm thick), and then the solvent was removed by heating at 160° C. for 5 minutes and a metal-clad adhesive film of 20 μm thick as shown in FIG. 2 was produced. Similarly to Embodiment 6, Table 1 shows the physical properties of the produced metal-clad adhesive film. Similarly to Embodiment 6, the adhesion of the film to copper foil is extremely high, and, additionally, lowering the glass transition temperature of the acrylic polymer makes it possible to attain a metal-clad adhesive tape with very excellent adhesion to copper under room temperature.

[Embodiment 8]

Figure 3:
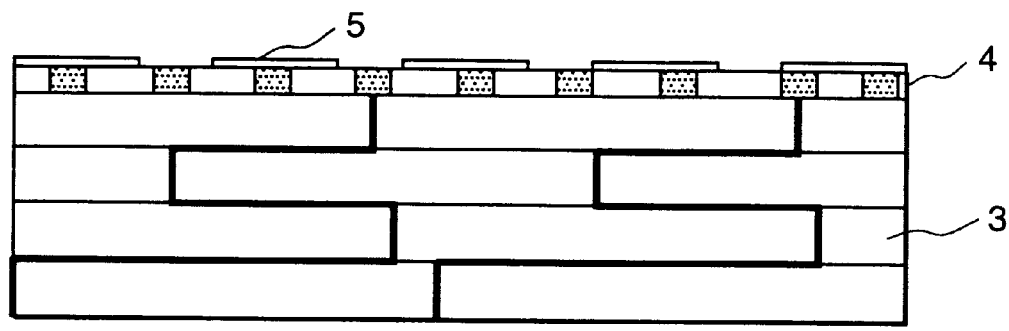
FIG. 3 is a diagram showing a cross-sectional view of a circuit board of a build-up structure on which an adhesive film is arranged.

The film produced in Embodiment 6 was incorporated, as an insulation layer for forming the surface circuit, on a FR-4 board (ANSI Standard: American National Standard Institute) with 6 layers, and a circuit board having a built-up structure that was electrically connected to the FR-4 board was produced as shown in FIG. 3. Electrodes for measuring the insulation resistance of the surface circuit were provided and the temperature dependency of the insulation resistance was measured.

The result was $10^{15}$ Ωcm or more under room temperature and $10^{11}$ Ωcm at 150° C. The electrodes were made in accordance with the surface resistance measurement method specified in JIS C 6481. As explained in connection with this embodiment, the film also has excellent electrical properties in the entire temperature range under a normal operating environment.

A thermal cycle test (−55° C./125° C., 500 cycles) of a circuit board alone was conducted and the result showed that the surface circuit was not affected by stress and, consequently, no problem such as disconnection was caused because the elastic modulus of the surface insulation layer was low. No separation was observed between the FR-4 board and the surface circuit layer.

Figure 4:
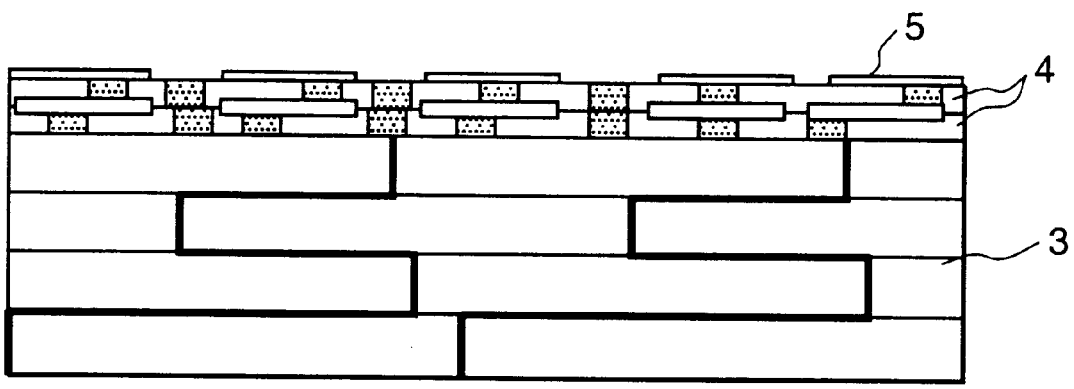
FIG. 4 is a diagram showing a cross-sectional view of a circuit board having a built-up structure on which layers of adhesive films are arranged in a multi-layer structure.
Figure 5:
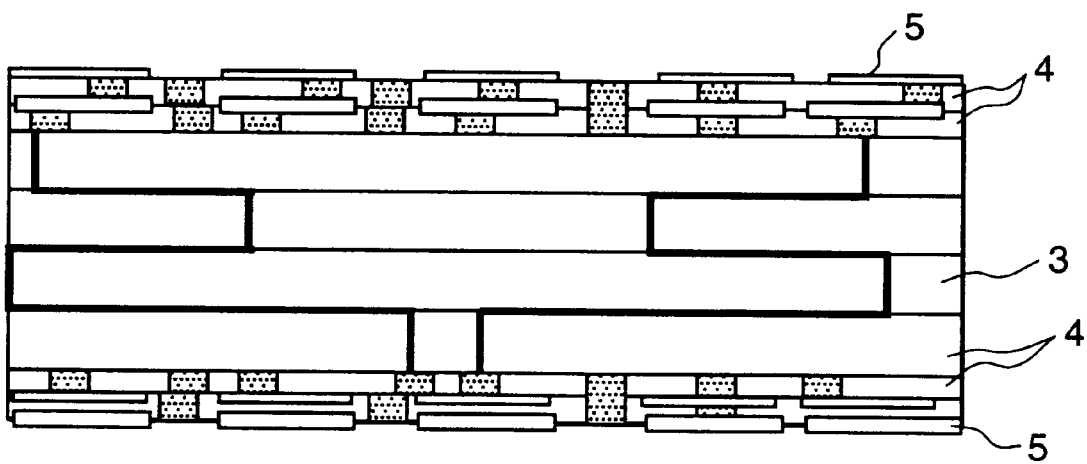
FIG. 5 is a diagram showing a cross-sectional view of a circuit board having a built-up structure on both sides of which an adhesive film is arranged.

FIG. 4 shows a built-up circuit board with a multi-surface circuit layer structure, produced in a similar manner as in this embodiment. FIG. 5 shows a built-up circuit board, wherein the surface circuit layers produced in a similar manner as in this embodiment are arranged on both sides of the board.

[Embodiment 9]

The metal-clad adhesive film produced in Embodiment 7 was incorporated, as an insulation layer for forming the surface circuit, on a FR-4 board (ANSI Standard: American National Standard Institute) with 6 layers, and a circuit board having a built-up structure that was electrically connected to the FR-4 board was produced.

Figure 6:
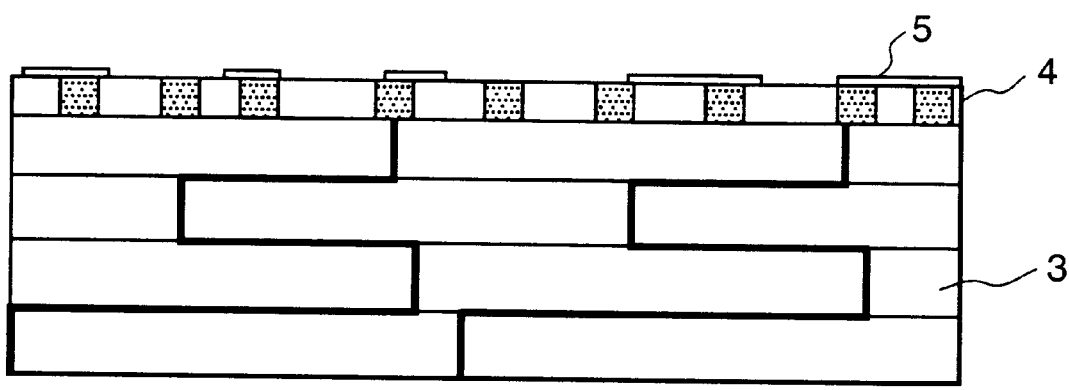
FIG. 6 is a diagram showing a cross-sectional view of an assembly structure in which a flip chip is mounted on a circuit board having a built-up structure.

Ten flip chips of 10 mm×5 mm (bump pitch: 0.15 mm, bump height: 0.1 mm) were mounted on the circuit board as shown in FIG. 6. Then, the board was subjected to a thermal cycle test (−55° C./125° C., 500 cycles) to check the reliability of the assembly and the connection reliability was evaluated by electrical check and visual check. (In FIG. 6., only one flip chip is shown as mounted.) As a result, even without having filled the connected portions with underfill resin, neither electrical disconnection nor mechanical cracking of the bump was observed. Providing an insulation layer of lower modulus of elasticity on the surface as indicated above makes it possible to attain excellent connection reliability in a thermal cycle test as well as in the temperature range of an operating environment.

[Comparison Sample 1]

An adhesive film was produced using the resin compound according to Embodiment 2, except for the use of polyamide imide with siloxane, and the properties were examined.

[Comparison Sample 2]

An adhesive film was produced using the resin compound according to Embodiment 2, except for the use of acrylic polymer, and the properties were examined.

[Comparison Sample 3]

A built-up circuit board was produced, using the same resin compound as in Comparison Sample 2 and in the same manner as in Embodiment 8, and was evaluated. As a result, it was found that separation was caused between the FR-4 board and the surface circuit layer in the thermal cycle test. The separation was caused probably because the modulus of elasticity of the surface circuit layer was high and consequently stress was caused by the difference in the coefficient of thermal expansion between the FR-4 board and the surface circuit layer.

[Comparison Sample 4]

A build-up circuit board using the same resin compound as in Comparison Sample 2 was produced and flip chips were mounted on it in the same manner as in Embodiment 9, and the connection reliability of the board was evaluated. As a result, when no underfill resin was applied, it was found that electrical disconnection was caused between the bump and the assembled board in 10 cycles.

TABLE 1

|  | Elastic modulus @ 50° C. (Mpa) | Soldering heat resistance* @ 300° C./2 min | Adhesive strength to copper (kN/m) | Glass transition temperature (° C.) |
| --- | --- | --- | --- | --- |
| Embodiment 3 | 23.5 | OK | 0.90 | 10 |
| Embodiment 4 | 17.5 | OK | 1.5 | 10 |
| Embodiment 5 | 13.5 | OK | 1.2 | −20 |
| Embodiment 6 | 12.8 | OK | 2.4 | 25 |
| Embodiment 7 | 8.5 | OK | 2.7 | −15 |

TABLE 1-continued

|  | Elastic modulus @ 50° C. (Mpa) | Soldering heat resistance* @ 300° C./2 min | Adhesive strength to copper (kN/m) | Glass transition temperature (° C.) |
| --- | --- | --- | --- | --- |
| Comparison Sample 1 | 150 | NG | 0.65 | 40 |
| Comparison Sample 2 | 2000 | OK | 0.80 | 200 |

*"OK" means neither separation nor blister is caused.
"NG" means separation and/or blister is caused.

Figure 7:
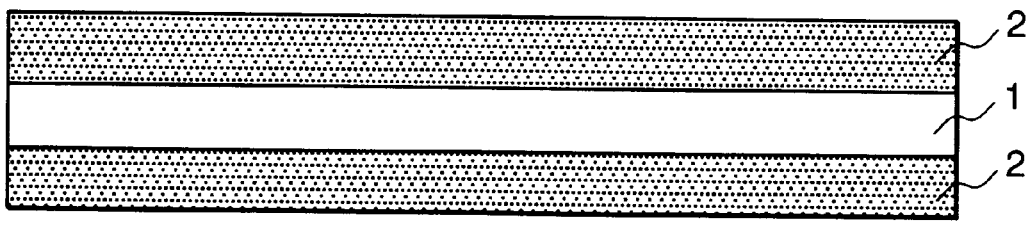
FIG. 7 is a diagram showing a cross-sectional view of an adhesive film on both sides of which a metal foil is arranged.

Sample: To measure the modulus of elasticity and the glass transition temperature, a film that was hardened at 200° C. for 30 minutes was used. To measure the solder heat resistance, an adhesive film as shown in FIG. 7 was used, where a copper foil was arranged on both sides of the film, or on one side in case of a one-sided copper-clad adhesive film, and the film was laminate-bonded at 200° C. for 30 minutes under 2 MPa pressure. To measure the adhesive strength, an adhesive film was provided on which copper was formed by spatter deposition and then a copper layer 20 μm thick was formed by electroplating using copper sulfate. The plating condition was 0.5A/dm² for 5 minutes +1.5A/dm² for 40 minutes under room temperature. To determine the adhesive strength of the metal-clad adhesive film, the peeling strength of the boundary between the copper foil and the applied varnish was measured.

Measuring method: To determine the modulus of elasticity and glass transition temperature, a sample was subjected to periodic strain using a visco-elastic measuring apparatus and the complex modulus of elasticity was measured. The storage modulus at 50° C. was determined to be the modulus of elasticity, and the peak temperature of tan δ obtained by the ratio of a real number part to an imaginary number part was determined to be the glass transition temperature.

The solder heat resistance and peeling strength were measured in accordance with the measurement method specified in JIS C 6481.

The resin compound and adhesive film realized by the present invention have both a low modulus of elasticity and a high heat resistance, as well as an excellent adhesion to metal and electrical properties. Because of this, the resin compound and adhesive film exhibit extremely superior properties as an insulation layer of a circuit board having a built-up structure on which flip chips and chip scale packages are mounted. In particular, high reliability can be attained without using an underfill structure, which is normally employed when flip chips are mounted on a board. As a result, an assembly structure with an excellent mass-production capability and good repairability can be provided.

What is claimed is:

1. A resin compound containing (A) polyamide imide with siloxane bond, (B) acrylic polymer with weight-average molecular weight of 500,000 or more, (C) thermoset resin, and (D) solvent.

2. A resin compound according to claim 1, wherein the thermoset resin is a resin that sets by reaction between epoxy resin and phenol compound.

3. resin compound according to claim 1, wherein siloxane bond content in acrylic polymer structure of the resin compound is 20 to 80 weight %.

4. A resin compound according to claim 1, wherein a mixing ratio of the polyamide imide with siloxane bond to the acrylic polymer is 3:1 to 1:5 by weight.

5. An adhesive film having a resin compound containing (A) polyamide imide with siloxane bond, (B) acrylic polymer with weight-average molecular weight of 500,000 or more, and (C) thermoset resin.

6. An adhesive film according to claim 5, wherein the thermoset resin is a thermoset resin containing epoxy compound, phenol hardener, and imidazole curing accelerator.

7. An adhesive film according to claim 5, wherein amount of the thermoset resin is 5 to 50 weight % of the adhesive film.

8. An adhesive film according to claim 5, having a modulus of elasticity at 50° C., after heating and curing the adhesive film, of less than 1 GPa.

9. An adhesive film having a resin compound containing (A) polyamide imide with siloxane bond, (B) acrylic polymer with weight-average molecular weight of 500,000 or more, wherein the glass transition temperature of the acrylic polymer is 0° C. or less, and thermoset resin.

10. A metal-clad adhesive film comprising a resin insulation layer, containing (A) polyamide imide with siloxane bond, (B) acrylic polymer with weight-average molecular weight of 500,000 or more, and (C) thermoset resin, and a metal.

11. A circuit board of a build-up structure on which there is arranged an adhesive film having a resin compound containing (A) polyamide imide with siloxane bond, (B) acrylic polymer with weight-average molecular weight of 500,000-or more, and (C) thermoset resin, said circuit board being electrically connected to external terminals.

12. An assembly structure in which there is arranged an adhesive film having a resin compound containing (A). polyamide imide with siloxane bond, (B) acrylic polymer with weight-average molecular weight of 500,000 or more, and (C) thermoset resin on a circuit board of a build-up structure, said circuit board being electrically connected to external terminals, and a flip chip is mounted on the circuit board via the external terminals.

* * * * *